United States Patent [19]

Kaegebein

[11] Patent Number: 4,565,972

[45] Date of Patent: Jan. 21, 1986

[54] TOWER MOUNTED PREAMPLIFIER

[75] Inventor: Daniel P. Kaegebein, Depew, N.Y.

[73] Assignee: TX RX Systems, Inc., Angola, N.Y.

[21] Appl. No.: 713,304

[22] Filed: Mar. 18, 1985

[51] Int. Cl.$^4$ ............................................. H03F 3/68
[52] U.S. Cl. .................................. 330/124 D; 330/51
[58] Field of Search ................. 330/51, 53, 84, 124 D, 330/124 R, 295, 297

[56] References Cited

U.S. PATENT DOCUMENTS

| | | | |
|---|---|---|---|
| 1,396,745 | 11/1921 | Haddock. | |
| 1,472,455 | 10/1923 | Blattner. | |
| 1,525,054 | 2/1925 | Toomey. | |
| 2,229,108 | 1/1941 | Maggio et al. | 178/44 |
| 2,647,176 | 7/1953 | Daly | 179/171 |
| 2,773,944 | 12/1956 | Karlson | 179/171 |
| 3,204,062 | 8/1965 | Foster et al. | 200/105 |
| 4,494,077 | 1/1985 | Fukaya et al. | 330/295 |

OTHER PUBLICATIONS

TS RX Systems, Inc., sheet literature reference entitled "Tower Mounted 800 MHz Low Noise Preamp With Bandpass Preselector Model 86-86-81188-R1".

*Primary Examiner*—Eugene R. LaRoche
*Assistant Examiner*—Steven J. Mottola
*Attorney, Agent, or Firm*—Bean, Kauffman & Bean

[57] ABSTRACT

A communications tower mounted amplifier system which includes a primary preamplifier circuit, a backup preamplifier circuit, and a bypass circuit mutually exclusively selectable through a relay switching means remotely controllable for bypassing the primary preamplifier with the backup preamplifier or the bypass circuit in the event of malfunction. The system includes an AC-to-DC power source and a backup battery system.

18 Claims, 1 Drawing Figure

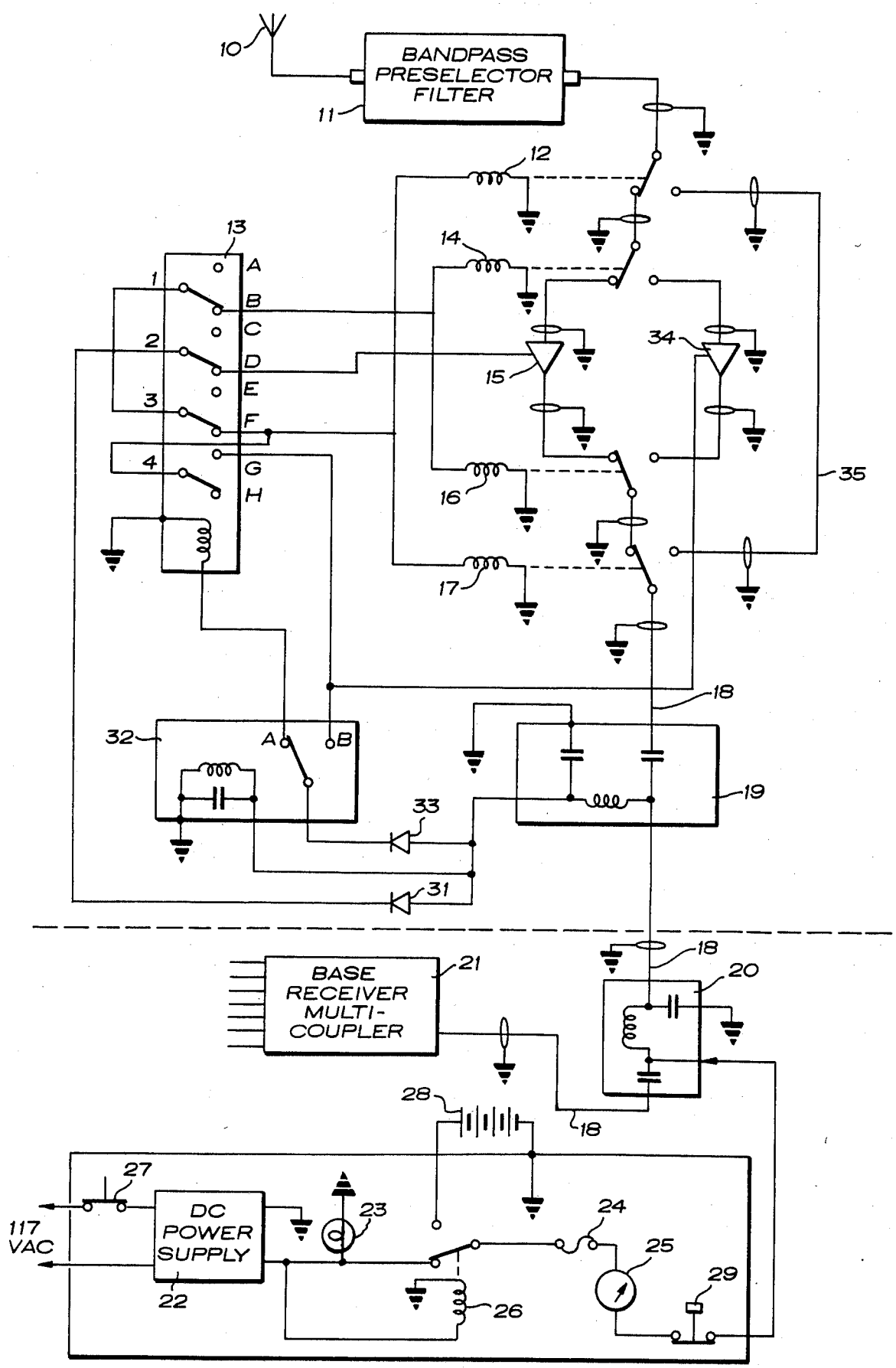

TOWER MOUNTED PREAMPLIFIER

THE INVENTION

This invention relates to tower mounted preamplifiers which include remotely controlled switching means for a backup amplifier circuit.

BACKGROUND OF THE INVENTION

An antenna tower mounted preamplifier offers up to a ten DB improvement in receiver sensitivity over preamplifier systems located at the base of the tower in that the former preserves the signal-to-noise ratio existing at the base of the antenna by amplifying signals before same are reduced in level by tower to ground transmission line losses. In that a tower mounted preamplifier is not readily available for maintenance in case of system failure, it has been the practice to provide a system which permits the tower mounted preamplifier to be bypassed and signals carried by the transmission line to a backup or secondary preamplifier located at ground level. However, the improvement in system sensitivity achieved by using a tower mounted preamplifier system is lost when the system is switched to the backup preamplifier, which is not located in the tower.

The use of an alternate amplifier circuit to be used in the event of a primary circuit failure is well known but all of the existing systems fail to provide a backup system suitable for a tower mounted application with remote control. For instance, J. Maggio et al, U.S. Pat. No. 2,229,108 on "Switching Of Spare Repeater Sections" issued Jan. 21, 1941 discloses the broad concept of a spare amplifier circuit in combination with a plurality of amplifier circuits. The system requires an intricate array of relays to provide a single spare circuit for a three circuit system and the extensive hardware required to provide the switching increases the probability of failure to a point which far exceeds any benefits which may be derived in overall reliability from inclusion of the spare circuit. An even more serious shortcoming of the Maggio et al system is the fact that the multi-pole, multi-throw relays incorporated in the system are satisfactory for high frequency operation but completely unsatisfactory for use with preamplifiers where RF frequencies are encountered.

Other examples of backup amplifier circuits may be found in Haddock, U.S. Pat. No. 1,396,745; Blattner, U.S. Pat. No. 1,472,455; Toomy, U.S. Pat. No. 1,525,054; Daly, U.S. Pat. No. 2,647,176; and Karlson, U.S. Pat. No. 2,773,944. None of the techniques utilized by these references lends itself to the use in a remote tower or to preamplifier systems operating in the RF range.

OBJECTIVES OF THE INVENTION

In view of the obvious inability of prior art amplifier systems incorporating backup circuits to function satisfactorily in remote transmission towers in an RF environment, it is a primary objective of the present invention to provide a remotely controlled alternate preamplifier circuit for a primary preamplifier circuit capable of functioning in the RF range.

A further objective of the present invention is to provide a remote controlled complete bypass circuit for a primary preamplifier circuit and its associated, backup preamplifier circuit.

A still further objective of the present invention is to provide a tower mounted preamplifier system including a spare, backup preamplifier circuit and a preamplifier bypass circuit, both remotely controllable through a series of RF coaxial relays responsive to a routing relay.

A further objective of the present invention is to provide a tower mounted preamplifier system including a backup preamplifier circuit and bypass circuit powered by a DC potential derived from an alternating current source with a backup battery power supply coupled to the preamplifier system via the tower RF transmission line.

SUMMARY OF THE INVENTION

This patent discloses a tower mounted preamplifier system which includes a primary preamplifier circuit, a backup preamplifier circuit which may be placed in service to bypass the primary preamplifier circuit and a bypass circuit for circumventing both preamplifiers if they become inoperative. Circuit switching is achieved through a remote ground station. The system utilizes four single-pole, double-throw RF coaxial relays to provide circuit routing through the primary preamplifier, the backup preamplifier or the bypass circuit. The RF coaxial relays are controlled by a four-pole, double-throw routing relay energized through a DC interrupt latching relay which provides selection of the service circuit (primary preamplifier circuit, backup preamplifier circuit or bypass circuit) through the simple expedient of a momentary interruption to the DC power source transmitted to the relays via the tower RF transmission line.

DESCRIPTION OF THE DRAWING

The single FIGURE is a schematic diagram of a preferred embodiment of the subject invention.

DESCRIPTION OF THE INVENTION

The tower mounted preamplifier system of the subject invention is comprised of tower mounted components illustrated about the dotted line in the FIGURE and remote power supply and control elements illustrated below the dotted line. The tower mounted portion of the system is enclosed in a stainless steel, water tight housing and provides a 24 DB gain for signals in the 800 Mhz range.

In the following description, a preferred embodiment incorporating relays is disclosed. However, any one or all may be replaced by electronic circuits such as flip-flops.

In the FIGURE, the signals received at the antenna 10 are applied through a bandpass preselector filter 11 to the pole contact of the single-pole, double-throw RF coaxial relay 12 which is normally energized through the F contact and No. 3 pole of routing relay 13. While relay 12 is energized, it connects the signal to the pole of the single-pole, double-throw RF coaxial relay 14 which is energized via the B contact and No. 1 pole of routing relay 13. When energized, relay 14 connects the signal to the primary amplifier circuit 15 which contains one or more RF preamplifiers which may be of the type utilizing operational amplifier bias control to assure stability. The DC bias voltage for the primary amplifier circuit 15 is provided via contact D and the No. 2 pole of routing relay 13.

RF coaxial relay 16 is a single-pole double-throw relay in parallel with relay 14 and in its energized state it couples the output of amplifier circuit 15 to a contact of relay 17 which is an RF coaxial single-pole, double-throw relay connected in parallel with relay 12. When energized, relay 17 connects the output of amplifier circuit 15 to the tower RF transmission line 18.

The tower RF transmission line 18 couples the signal through RF suppressors 19 and 20 to the base receiver multi-coupler 21.

A DC power supply 22 rectifies 117 VAC line current to provide 12 volts DC to the tower mounted relays and amplifiers via the tower RF transmission line 18. The power supply circuit includes an indicator lamp 23, fuse 24 and DC current meter 25. Current from power supply 22 is coupled to fuse 24 via relay 26 which is energized as long as the DC power supply 22 is functioning. In the event of a power failure or deactivation of the DC power supply by the switch circuit breaker 27, relay 26 becomes deenergized and standby battery 28 is switched into the circuit. Regardless of its source, the DC current flowing through meter 25 passes through interrupt switch 29 and is coupled to the tower RF transmission line 18 by a DC bias injector 20 which also functions as an RF suppressor.

A second RF suppressor 19 provides a DC tap which supplies the DC voltage to poles 1, 2 and 3 of routing relay 13 via isolation diode 31. The DC voltage is also applied to the coil of relay 32 which is a single-pole, double-throw DC latching relay that applies the DC voltage supplied through isolation diode 33 to the coil of relay 13 or alternately to contact G of relay 13 and the bias input to the backup amplifier circuit 34 which may be identical to the primary amplifier circuit 15.

During normal operation, the primary amplifier circuit indicated by 15 in the schematic diagram is placed in the circuit by the four single-pole, double-throw RF coaxial relays 12, 14, 16 and 17 which are energized via contacts B and F of relay 13. If amplifier circuit 15 fails, interrupt switch 29 may be depressed to cause latching relay 32 to toggle and remove the energizing current from the coil of relay 13. Relay 32 includes a capacitor across its coil to delay operation of the relay approximately one to two seconds to prevent activation of the relay by a minor anomaly in the DC power supply. With relay 32 latched in the B position, relay 13 is deenergized which deenergizes relays 14 and 16. When relays 14 and 16 are deenergized, amplifier circuit 15 is switched out of the circuit and backup amplifier 34 is switched in. The bias voltage is disconnected from amplifier 15 but connected to amplifier 34 and relays 12 and 17 are held energized via the contact G and interconnection between the No. 4 pole and the connection an pin F of relay 13.

Relay 32 will remain latched in the B position when current is reestablished through interrupt switch 29.

The DC current meter 25 monitors total current draw from the power source and thereby provides an indication as to which amplifier circuit is working. When all four RF coaxial relays, 12, 14, 16 and 17 are energized, the current draw is relatively high, indicating that the primary circuit is active. When the current draw is low, it is an indication that relays 14 and 16 are deenergized causing the active circuit to be the backup amplifier circuit 34.

When latching relay 32 is latched in the B position, it can be returned to the A position by again depressing interrupt switch 29 and holding it depressed for a period long enough to overcome the effects of the capacitor in parallel with the relay coil. This latches the relay in the A position and places the primary amplifier circuit 15 back in service.

In the preferred embodiment, interrupt switch 29 is a push-to-break momentary off switch which may be mechanically latched open to disconnect the DC power supply or backup battery. This causes RF coaxial relays 12 and 17 to be deenergized, as well as the rest of the relays in the tower mounted portion of the system (above the dashed line in the FIGURE). With relays 12 and 17 deenergized, both amplifier circuits are bypassed by the second backup system which is comprised of RF transmission line 35. The need to mechanically latch switch 29 open to enter the second bypass mode may be eliminated by the use of an on-off switch in series with switch 29.

While preferred embodiments of this invention have been illustrated and described, variations and modifications may be apparent to those skilled in the art. Therefore, I do not wish to be limited thereto and ask that the scope and breadth of this invention be determined from the claims which follow rather than the above description.

What I claim is:

1. An amplifier system, comprising:
   an input transmission line;
   an output transmission line;
   a primary amplifier circuit;
   a backup amplifier circuit;
   an amplifier system power supply;
   amplifier switching means for mutually exclusively connecting said primary amplifying circuit or said backup amplifying circuit between said input transmission line and said output transmission line;
   routing switching means for controlling said amplifier switching means; and
   latching switch means responsive to interruptions in an output from said amplifier system power supply for setting said routing switching means in a first or second mode.

2. An amplifier system as defined in claim 1, further comprising:
   a bypass circuit; and
   bypass switching means for mutually exclusively connecting said bypass circuit or said amplifier switching means and primary amplifier circuit or backup amplifier circuit between said input transmission line and said output transmission line.

3. An amplifier system as defined in claim 1 wherein said latching switch means includes capacitive means for preventing said interruptions in said output from said amplifier system power supply which have a duration less than a predetermined time from affecting said latching switch means.

4. An amplifier system as defined in claim 1 wherein said amplifier system power supply comprises:
   DC circuit means for connecting a DC voltage from said amplifier system power supply to said latching switch means, said routing switching means, said amplifier switching means, said primary amplifier circuit, and said backup amplifier circuit; and
   interrupt switching means for interrupting said DC circuit to cause toggling of said latching switch means.

5. An amplifier system as defined in claim 1 wherein said amplifier switching means comprises first and second single-pole, double-throw RF coaxial relays.

6. An amplifier system as defined in claim 1 wherein said routing switching means comprises a relay including four single-pole, double-throw sets of contact.

7. An amplifier system as defined in claim 1 wherein said latching switch means comprises a single-pole, double-throw relay.

8. An amplifier system as defined in claim 2 wherein said bypass switching means connects said bypass circuit between said input transmission line and said output transmission line in response to a loss of DC power from said amplifier system power supply.

9. An amplifier system as defined in claim 2 wherein one of said switching means is a relay.

10. An amplifier system as defined in claim 2 wherein said bypass switching means comprises a single-pole, double-throw RF coaxial relay.

11. An amplifier system as defined in claim 4, further comprising:
    an AC-to-DC converter;
    a backup power supply system; and
    switching means for mutually exclusively connecting said AC-to-DC converter output or said backup power supply to said DC circuit means, said switching means operable between a first and second position in response to a DC output from said AC-to-DC converter.

12. An amplifier system as defined in claim 4 wherein said interrupt switching means is a normally-closed, momentary-on switch.

13. An amplifier system as defined in claim 4 wherein said DC circuit means further comprises a first RF suppressor for coupling DC voltage to said output transmission line and a second RF suppressor for coupling said DC voltage from said output transmission line.

14. An amplifier system as defined in claim 11 wherein said backup power supply comprises a battery power source.

15. An amplifier system as defined in claim 11, further comprising current flow responsive means for indicating the status of said primary amplifier circuit and said backup amplifier circuit as a function of current draw by said amplifier switching means.

16. An amplifier system as defined in claim 15 wherein said DC circuit means comprises said output transmission line for connecting DC voltage to said latching switch means, amplifier switching means, routing switching means, primary amplifier circuit, and backup amplifier circuit.

17. An amplifier system, comprising:
    an input transmission line;
    an output transmission line;
    a primary amplifier circuit;
    a backup amplifier circuit;
    a bypass circuit;
    a first single-pole, double-throw RF coaxial relay including a throw contact connected to an input to said primary amplifier circuit and a throw contact connected to an input to said backup amplifier circuit;
    a second single-pole, double-throw RF coaxial relay including a throw contact connected to an output from said primary amplifier circuit and a throw contact connected to an output from said backup amplifier circuit;
    a third single-pole, double-throw RF coaxial relay mutually exclusively connecting said bypass circuit or the pole of said first single-pole, double-throw RF coaxial relay to said input transmission line;
    a fourth single-pole, double-throw RF coaxial relay mutually exclusively connecting said bypass circuit or the pole of said second single-pole, double-throw RF coaxial relay to said output transmission line;
    a four-pole, double-throw relay means for controlling said first, second, third, and fourth single-pole, double-throw RF coaxial relays; and
    a single-pole, double-throw relay mutually exclusively energizing said four-pole, double-throw relay or said third and fourth single-pole, double-throw RF coaxial relays.

18. An amplifier system, comprising:
    an input transmission line;
    an output transmission line;
    a primary amplifier circuit;
    a backup amplifier circuit;
    a power source;
    a bypass circuit;
    a first switching means;
    a second switching means for mutually exclusively connecting said primary amplifier circuit or said backup amplifier circuit to said first switching means;
    said first switching means including circuit means for mutually exclusively connecting said bypass circuit or said second switching means to said input transmission line;
    a third switching means;
    a fourth switching means for mutually exclusively connecting said primary amplifier circuit or said backup amplifier circuit to said third switching means;
    said third switching means including circuit means for mutually exclusively connecting said bypass circuit or said fourth switching means to said output transmission line;
    a fifth switching means for controlling said first, second, third, and fourth switching means;
    a sixth switching means including first and second states for mutually exclusively activating said fifth switching means or said first and third switching means in response to interruptions in power from said power source; and
    means to interrupt power from said power source.

* * * * *